United States Patent [19]
Kobayashi

[11] Patent Number: 6,094,099
[45] Date of Patent: Jul. 25, 2000

[54] HIGH DYNAMIC RANGE VARIABLE GAIN DISTRIBUTED AMPLIFIER

[75] Inventor: Kevin W. Kobayashi, Torrance, Calif.

[73] Assignee: TRW Inc., Redondo Beach, Calif.

[21] Appl. No.: 09/176,086

[22] Filed: Oct. 20, 1998

[51] Int. Cl.[7] ............................... H03F 3/45; H03F 3/60
[52] U.S. Cl. ........................ 330/254; 330/261; 330/54
[58] Field of Search .................................... 330/252, 254, 330/261, 295, 54

[56] References Cited

U.S. PATENT DOCUMENTS

| | | | |
|---|---|---|---|
| 4,992,752 | 2/1991 | Cioffi | 330/54 |
| 5,550,513 | 8/1996 | Wong | 330/54 |
| 5,559,472 | 9/1996 | Kobayashi | 330/54 |
| 5,751,190 | 5/1998 | Nguyen et al. | 330/254 |

OTHER PUBLICATIONS

Thomas Y. K. Wong, et al., "A 10 Gb/s AlGaAs/GaAs HBT High Power Fully Differential Limiting Distributed Amplifier for III–V Mach–Zehnder Modulator", Oct. 1996, pp. 1388–1393, IEEE Journal of Solid State Circuits, vol. 31, No. 10.

William J. Thompson, "A Broadband Low Noise Dual Gate FET Distributed Amplifier", 1988, pp. 11–13, IEEE 1989 Microwave and Millimeter–Wave Monolithic Circuits Symposium.

Pieter J. G. Van Lieshout, et al., "A Monolithic Wideband Variable Gain Amplifier with a High Gain Range and Low Distortion", 1997, pp. 358–359, 1997 IEEE International Solid State Circuits Conference.

*Primary Examiner*—Benny Lee
*Assistant Examiner*—Patricia T. Nguyen
*Attorney, Agent, or Firm*—Michael S. Yatsko

[57] ABSTRACT

A dc distributed Gm gain control circuit formed from differential bipolar distributed amplifier topology. In accordance with an important aspect of the invention, the distributed Gm gain control relies on a shunt configured, area weighted, transistor current source switches ($QA_x$, $QB_x$, $QC_x$, $QD_x$) for each differential amplifier stage (22, 24, 26, 28) of the distributed amplifier (20) in order to control the offset voltages of each differential amplifier stage (22, 24, 26, 28) without imposing performance degradation by way of a series resistive ladder.

11 Claims, 5 Drawing Sheets

HIGH DYNAMIC RANGE VARIABLE GAIN DISTRIBUTED AMPLIFIER

BACKGROUND OF THE INVENTION

1. Field of the Invention

The present invention relates to a variable gain amplifier (VGA) and more particularly to a high linearity gain distributed variable gain amplifier which provides enhanced performance in both RF and digital communication systems.

2. Description of the Prior Art

Wideband variable gain amplifiers (VGA) with high linearity are used in various signal control applications, such as instrumentation RF communications and lightwave optoelectronic communication systems. In such communication systems, it is desirable to have a high linearity VGA for receiver applications in order to obtain a relatively high dynamic range. In RF communications, it is desirable that the VGA have good linearity and low intermodulation distortion at the VGA's low gate gain setting when the incident signal is at a peak in power level during reception. In digital light wave communication applications, it is desirable to maintain good phase and amplitude linearity and broad bandwidth, especially in the presence of a high power signal in order to maintain good reception. In these systems, it is desirable that the VGA cover a wide frequency range from dc to about 3 times the highest bit rate in order to ease its architectural implementation and maintain good receiver sensitivity and bit-error rate (BER).

In digital communication systems, and specifically receiver applications, there is a need for VGAs with high linearity, wide bandwidth and direct coupled capability. A VGA in such an application must have the following characteristics: low intermodulation distortion and excellent phase and amplitude linearity over a relatively wide gain control range especially at low gain settings; direct coupled capability (i.e. no dc blocking capacitors in the RF path) allowing frequency performance down to dc; and high upper end bandwidth response.

VGAs are known in the art. An example of a VGA is disclosed in "A Monolithic Wideband Variable Gain Amplifier With a High Gain Range and Low Distortion", by P. van Lieshout et al. *IEEE International Solid State Circuits Conference Digest,* February, 1997, pp. 358–359. However, the practical employment of the VGA Gm gain control technique described in the above-mentioned reference is not amenable to the required distributed amplifier RF performance for several reasons. Firstly, the disclosed Gm gain control technique uses a resistive ladder to create the distributed dc offset voltages for the parallel connected differential amplifiers for the different distributed amplifier sections. This resistive ladder is in series with the RF input path and thus is nonattractive with a distributed amplifier topology because the series resistive ladder produces resistive transmission line attenuation that is cumulative with each additional section of distributed amplifier, thus causing decreasing benefits with each successive stage. In addition, the restrictive ladder limits the practical number of stages or sections that can be used and therefore limits the total gain control, which is a function of the number of sections and differential amplifier stages. Secondly, the Gm gain control disclosed in the above mentioned reference requires a current switching network for employing variable (tunable) dc voltage offset for the variable Gm gain control. This current switching network is typically formed from a differential current source switch which loads down the input synthetic transmission lines of the distributed amplifier with its high impedance collectors and thus causes instability as well as limited frequency bandwidth performance.

Other VGA amplifiers are known, for example, as disclosed in "A Broadband Local Noise Dual Gate FET Distributed Amplifier" by W. Thompson, 1989 *IEEE MMWMC-S Digest,* pp. 11–14. The variable gain amplifier disclosed in this reference utilizes a dual gate FET. However, such dual gate VGAs present a major disadvantage. In particular, dual gate FETs operated as VGAs are known to not maintain the linearity characteristics at low gain states and in fact actually get worse at low gain settings. Thus, there is a need for a high linearity variable gain distributed amplifier which can provide enhanced performance in various systems including RF and communication systems.

SUMMARY OF THE INVENTION

Briefly, the present invention relates to a dc distributed Gm gain control circuit formed from a differential bipolar distributed amplifier topology. In accordance with an important aspect of the invention, the distributed Gm gain control relies on a shunt configured, area weighted, transistor current source switches for each differential amplifier section of the distributed amplifier in order to control the offset voltages of each differential amplifier section without imposing performance degradation by way of a series resistive ladder.

DESCRIPTION OF THE DRAWINGS

These and other benefits of the present invention will be readily understood with reference to the following specification and attached drawings wherein.

DETAILED DESCRIPTION

Figure 1:
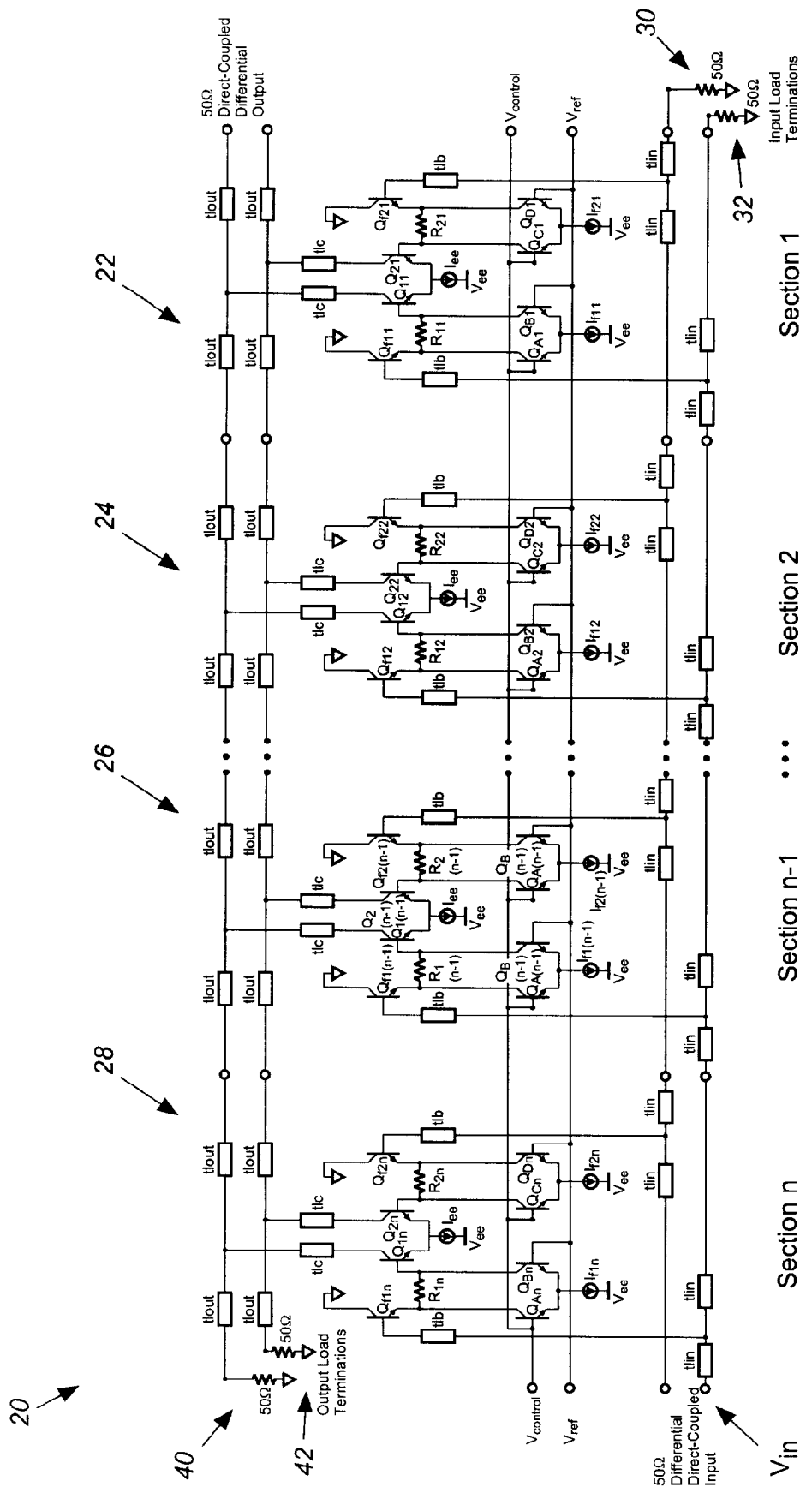
FIG. 1 is a schematic diagram of a variable gain differential distributed amplifier in accordance with the present invention.

FIG. 1 is a schematic diagram of variable gain differential distributed amplifier in accordance with the present invention. As will be discussed in more detail below, the distributed amplifier in accordance with the present invention utilizes a distributed Gm gain control methology based upon shunt configured area-weighted transistor current source switches for each differential amplifier section of the distributed amplifier. This methology is used to control the offset voltages of each differential amplifier section without imposing performance degradation by existence of a series resistive ladder.

The distributed amplifier in accordance with the present invention may be employed with bipolar active devices due to their excellent differential balanced operation.

The distributed amplifier in accordance with the present invention, generally identified with the reference numeral 20, consists of "n" differential amplifier stages 22, 24, 26, 28, each stage 22, 24, 26, 28 forming a distributed section of the distributed amplifier 20. As in conventional distributed amplifiers, each of the two differential inputs are formed from a synthetically constructed series-shunt L-C distributed transmission-line network using series inductive transmission line elements $t_{lin}$, shunt base feed elements, $t_{fb}$, and an effective shunt capacitive impedance to ground provided by the impedance of the input transistors of the differential amplifier of each stage 22, 24, 26, 28. In order to accommodate RF performance down to dc, 50 Ω shunt resistors to ground 30, 32, may be used to provide the input transmission line terminations.

Each of the two differential outputs of the distributed amplifier 20 is formed from a synthetically constructed series inductive transmission line elements $t_{lout}$, shunt collector feed elements, $t_{fc}$, and an effective shunt capacitive impedance to ground provided by the impedance of the collectors of the output transistor of the differential amplifier of each section. Just like the input, 50 Ωshunt resistors 40, 42 may be used to provide broadband output transmission line load terminations in order to accommodate direct-coupled operation to the next stage 22, 24, 26 and 28. Each stage 22, 24, 26, 28 also includes differential amplifier formed from a pair common emitter transistor $Q1_x$ and $Q2_x$ and a current source Iee. The current source Iee is connected to a negative supply Vee.

Each of the "n" differential amplifier stages 22, 24, 26, 28 includes a pair of common-collector transistors $Qf1_x$ and $Qf2_x$, which feed a pair of series resistors $R1_x$ and $R2_x$ that provide dc offset bias voltages to the base inputs of the common-emitter differential pair transistors $Q1_x$, $Q2_x$. The input common-collector transistors $Qf1_x$ and $Qf2_x$ provide several functions. First, they provide a dc level shift such that the common-emitter output differential pair transistors $Q1_x$, $Q2_x$ can operate with maximum linearity under direct coupled operation by providing more $V_{ce}$ headroom for the transistors $Q1_x$ and $Q2_x$. Secondly, the transistors $Qf1_x$, $Qf2_x$ provide an impedance transformation which compensates the loss generated by the series dc offset resistors $R1_x$ and $R2_x$, for example, as described in detail in commonly owned U.S. Pat. No. 5,559,472, hereby incorporated by reference.

The dc-offset voltage and corresponding dc-distributed Gm gain control characteristics are realized by steering current through the dc offset resistors R1 and R2 of each stage 22, 24, 26, 28 using differential current source switches formed from area weighed transistors $QA_x$, $QB_x$, $QC_x$ and $QD_x$, and fixed current sources If1 and If2 for steering variable current through the resistors R1 and R2, respectively. The fixed current sources If1 and If2, which may be connected to a fixed supply Vee, set a fixed bias current for the common-collector transistors Qf1 and Qf2, respectively. In this manner, the current can be steered through the offset resistors R1 and R2 by adjusting an external control voltage $V_{control}$ to produce a electronically tunable offset voltage to each of the "n" differential amplifier stages without RF performance degradation due to bias current changes in Qf1 and Qf2 of each differential amplifier section. If the offset resistors R1 and R2 are equal and are the same for all of the stages 22, 24, 26, 28 of the distributed amplifier 20, it is the nominal current sourced through these resistors R1 and R2 which determines the offset voltage drops for each of the differential amplifier sections. Because these resistors R1, R2 are the same for all the amplifier stages 22, 24, 26, 28, the distributed amplifier 20 operates as a uniformly distributed traveling wave amplifier where each differential amplifier stage 22, 24, 26, 28 section has an equal gain contribution to the total.

Figure 2:
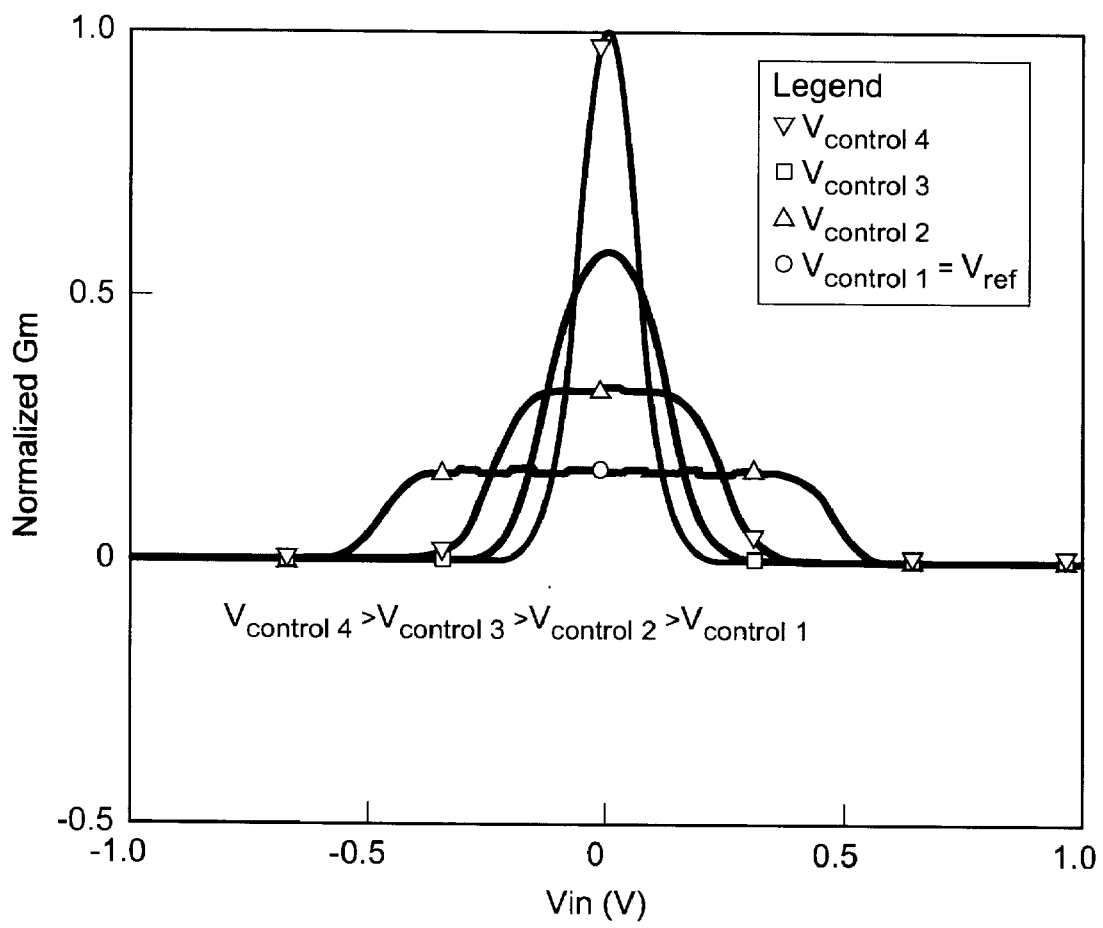
FIG. 2 is a graphical illustration illustrating the normalized dc gain Gm as a function of the input voltage Vin of n=8 section distributed amplifier in accordance with the present invention.

A supply voltage Vref is used to set the threshold reference for the current source switches $QA_x$, $QB_x$, $QC_x$, $QD_x$ controlled by $V_{control}$. At a nominal voltage $V_{control}$ equal to Vref, it is the proportion of the HBT emitter areas of the current source switch transistors $QA_x$, $QB_x$, $QC_x$, and $QD_x$, which determines the specific offset currents and voltage for each of the differential-amplifier stages 22, 24, 26, 28. In turn, the offset voltages provided for each differential amplifier stage 22, 24, 26, 28 offsets each differential amplifier's Gm vs. Vin characteristics. As is known in the art, a broad Gm vs. Vin characteristic which produces high linearity may be achieved by providing a plurality of differential amplifier stages in parallel with differential voltage-offset Gm characteristics. In this manner the gain Gm of multiple differential amplifier stages 22, 24, 26, 28 can be distributed across input voltage using a carefully planned offset in order to maintain a low and flat Gm vs. Vin profile as is illustrated in FIG. 2. In particular, FIG. 2 illustrates the normalized dc gain Gm versus input voltage Vin of an n=8 stage distributed amplifier for the case where $V_{control1}$=Vref. By increasing a tuning voltage $V_{control}$, the currents may be steered in a direction which reduces the differential offset voltages between the bases of transistors Q1 and Q2 of each stage 22, 24, 26, 28. This collapses the input voltage range where linear gain Gm is achieved and produces larger peak gain Gm values. As $V_{control}$ is increased further, there is a point where the gain Gm voltage offset of each stage 22, 24, 26, 28 will all coincide and maximum Gm and gain will be obtained from the amplifier 20. The theoretically maximum linear gain control range is given as 20 log(n), where n is the number of sections of the distributed amplifier. For n=8, the theoretical limit is 18 dB. The corresponding simulated gain control range is 15.7 as given in FIG. 2.

The relative HBT emitter areas of the current source switch transistors QA, QB, QC, and $QD_x$, is a function of the total number of stages 22, 24, 26, 28 and is derived under the lowest gain-state condition where $V_{control}$=$V_{ref}$. For each of the distributed amplifier stages 22, 24 26, 28, the following device areas are equated; $AREA_{QA}$=$AREA_{QC}$ and the $AREA_{QB}$=$AREA_{QD}$. Here we define the total current-source switch area to each of the transistors QA, QB, QC, and QD will be defined as a fraction of this unit current switch area, Ao. Given the total number of stages 22, 24, 26, 28, n is an even number greater than 1, the emitter areas of the current source transistors is expressed by the following equations"

For i=1 to (n/2), the ith and [(n+1)−i]th stages will have the following areas:

$$AREA_{QAi} = AREA_{QB(n+1-i)} = A \cdot \frac{\left[\frac{n}{2} + 1 - \frac{i-1}{2}\right]}{\left[\frac{n}{2} + 2\right]}$$

and $$AREA_{QBi} = AREA_{QA(n+1-i)} = A_o \cdot \frac{\left[1 + \frac{i-1}{2}\right]}{\left[\frac{n}{2} + 2\right]}$$

Given that the number of stages, "n", is an odd number greater than 1, the nth stage will have all equal areas, $$AREA_{QAn} = AREA_{QBn} = AREA_{QCn} = AREA_{QDn} = \frac{A_o}{2}$$

and all the emitter areas of the current source transistors of the (n−1) remaining stages will be given by the following:

For i=1 to [(n−1)/2)] the ith and [(n−i]th stages will have the following areas:

$$AREA_{QAi} = AREA_{QB(n-i)} = A \cdot \frac{\left[\frac{(n-1)}{2} + 1 - \frac{i-1}{2}\right]}{\left[\frac{(n-1)}{2} + 2\right]}$$

and $$AREA_{QBi} = AREA_{QA(n-i)} = A_o \cdot \frac{\left[1 + \frac{i-1}{2}\right]}{\left[\frac{(n-1)}{2} + 2\right]}$$

Figure 3:
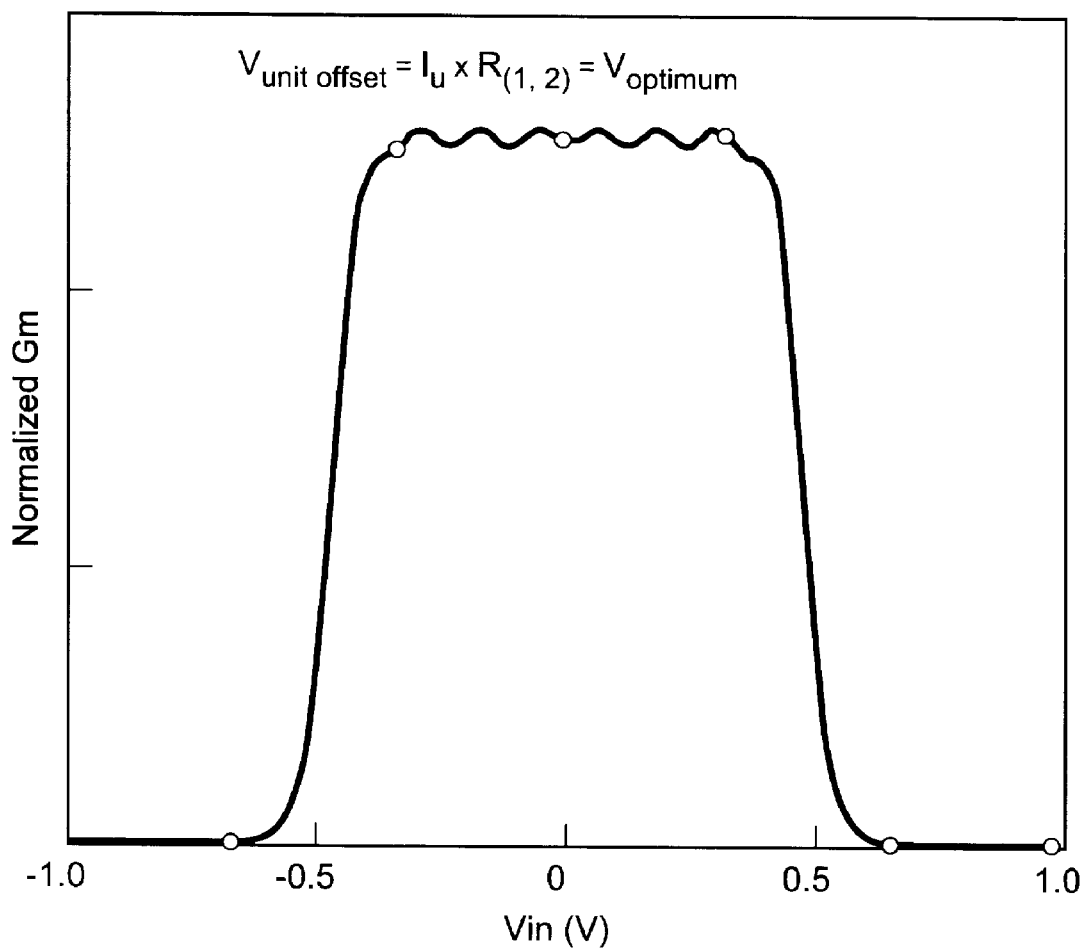
FIG. 3 is a graphical illustration illustrating the distributed dc gain where the $V_{unit\ offset}$ produces the optimal case where the Gm is correctly compensated.
Figure 4:
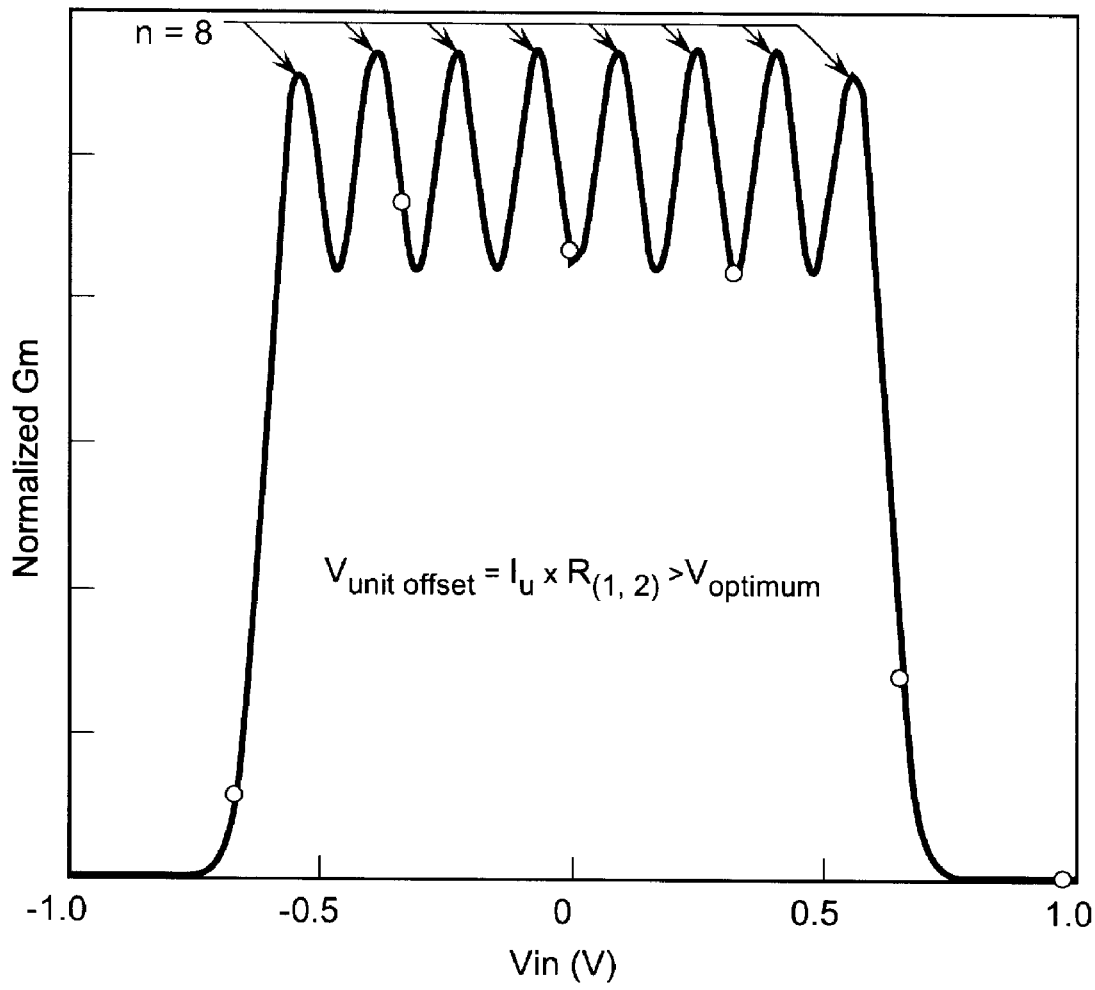
FIG. 4 is a graphical illustration illustrating the dc gain of a distributed amplifier in accordance with the present invention, where the $V_{unit\ offset}$ produces the case where the Gm is over compensated.
Figure 5:
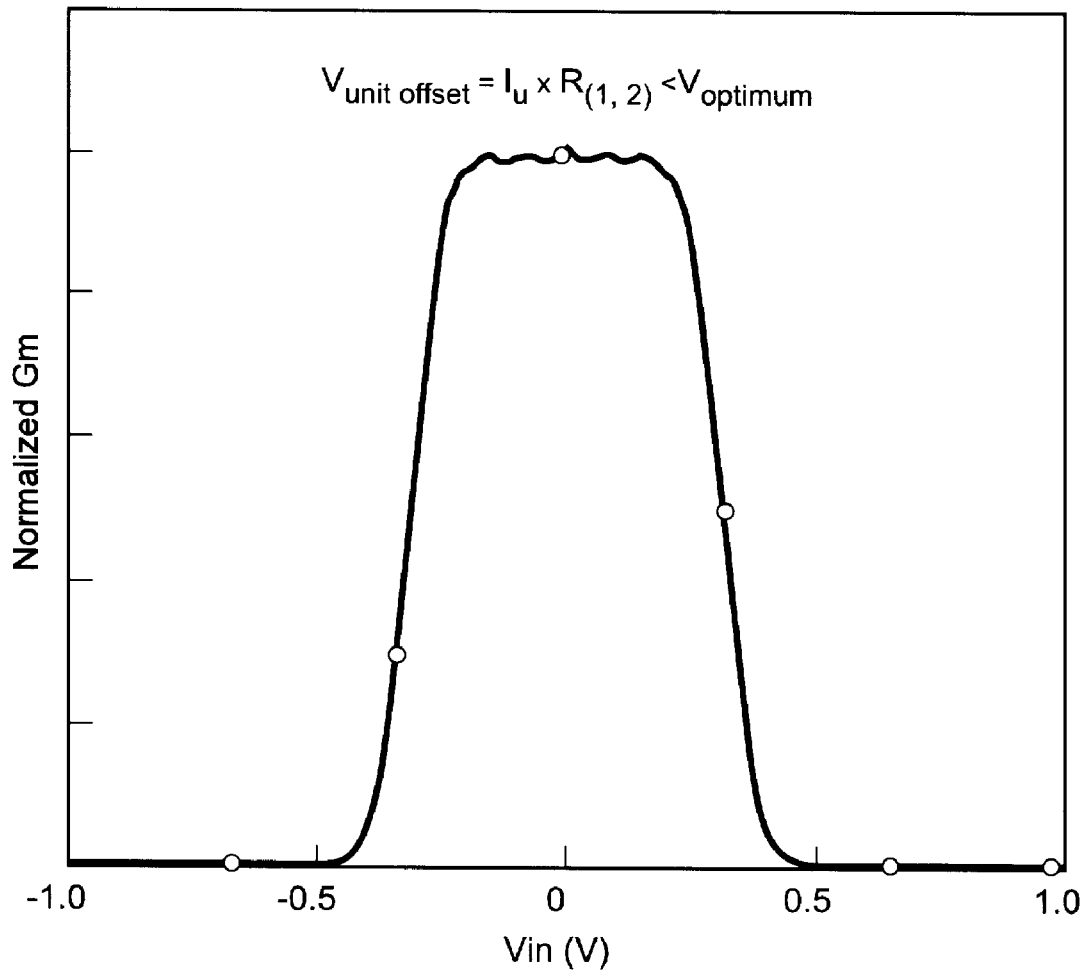
FIG. 5 is a graphical illustration similar to FIG. 3 in the case where the Gm is under compensated.

A unit offset current can be defined as $I_u = If1 \cdot [1/(n/2+2)]$ for n even, and $I_u = If1 \cdot [1/((n-1)/2+2)]$ for n odd. A corresponding unit offset voltage may be defined as $V_{unit\ offset} = Iu \cdot R_{offset}$ where R1=R2. The equation above provides that integer multiples of this offset voltage is distributed in a manner such that the Gm characteristics of each differential amplifier stage 22, 24, 26, 28 is evenly distributed across input voltage, Vin. By proper choice of the $R_{offset}$(=R1=R2) and the unit current $I_u$, which is dependent on the current sources If1 and If2 that set the operating currents of Qf1 and Qf1, an optimum unit voltage offset results which produces a maximally flat distributed dc Gm vs. Vin characteristic and correspondingly high linearity VGA performance. This is illustrated in FIGS. 3, 4 and 5, which illustrate the distributed dc-Gm cases. FIG. 3 gives the distributed dc-GM correctly compensated. FIG. 4 gives the distributed dc-GM cases where $V_{unit\ offset}$ produces a Gm which is over-compensated. FIG. 5 gives the distributed dc-Gm cases where $V_{unit\ offset}$ produces a Gm which under-compensated.

Obviously, many modifications and variations of the present invention are possible in light of the above teachings. Thus, it is to be understood that, within the scope of the appended claims, the invention may be practiced otherwise than as specifically described above as follows:

What is claimed is:

1. A variable gain amplifier comprising:
   a pair of differential input transmission lines;
   a pair of differential output transmission lines;
   one or more amplifier stages connected between said pairs of differential input and differential output transmission lines, each amplifier stage comprising:
   a current source;
   a differential amplifier defining a pair of inputs coupled between said output transmission lines and said current source;
   a first biasing circuit for providing a biasing voltage to each of said differential amplifiers, said biasing circuit including first and second dc offset biasing resistors electrically connected to said pair of input of said differential amplifier; and
   a second circuit for varying the current through said dc offset resistors, said circuit including a plurality of current source switches controllable by an external dc voltage source.

2. The variable gain amplifier as recited in claim 1, wherein said differential amplifier includes a pair of common-emitter configured bipolar transistors defining a common emitter, connected to said current source and first and second collectors connected to said differential output transmission lines.

3. The variable gain amplifier as recited in claim 2, wherein said biasing circuit includes a pair of transistors.

4. The variable gain amplifier as recited in claim 3, wherein said pair of transistors are bipolar transistors connected in a common collector configuration having emitters connected to said dc bias resistors and bases connected to said differential input transmission line.

5. A variable gain amplifier comprising:
   a pair of differential input transmission lines;
   a pair of differential output transmission lines;
   one or more amplifier stages connected between said pairs of differential input and differential output transmission lines, each stage comprising:
   a current source;
   a differential amplifier defining a pair of inputs coupled between said output transmission lines and said current source, said differential amplifier including a pair of common emitter configured bi-polar transistors defining a common emitter connected to said current source and first and second collectors connected to said differential output transmission lines;
   a first biasing circuit for providing a biasing voltage to said differential amplifier, said biasing circuit including first and second dc offset biasing resistor electrically connecting to said pair of inputs of said differential amplifier, said biasing circuit including a pair of bipolar transistors connected in a common collector configuration having emitters connected to dc bias resistors and basis connected to said differential transmission line; and
   a second circuit for varying a current through said dc offset resistors, said circuit including a plurality of current source switches controllable by an external dc voltage source, wherein said plurality of current source switches are formed from two pairs of common-emitter connected transistors $QA_x$, $QB_x$ and $QC_x$, $QD_x$, defining a plurality of collectors and bases, said common-emitter connected to a common current source and said collectors connected to said dc bias resistors, said bases connected a reference voltage and an external source of variable dc.

6. The variable gain amplifier as recited in claim 5, wherein said current source switch transistors are heterojunction bipolar transistors (HBT).

7. The variable gain amplifier as recited in claim 5, wherein the emitter area of each of transistors is varied in order to control the offset voltage for each stage.

8. The variable gain amplifier as recited in claim 5, wherein said emitter area is varied as a function of the total number of stages.

9. The variable gain amplifier as recited in claim 8, wherein the current source transistor pairs $QA_x$, $QB_x$ is coupled to said first dc offset resistor and said current source transistor pair $QC_x$, $QD_x$ is coupled to said second dc offset resistor.

10. The variable gain amplifier as recited in claim 9, where the emitter area of $QA_x$ is formed to be equal to the emitter area of $QB_x$.

11. The variable gain amplifier as recited in claim 10, where the emitter area of $QC_x$ is formed to be equal to the emitter area of $QD_x$.

* * * * *